United States Patent
Mushirabad et al.

(10) Patent No.: US 7,398,443 B2
(45) Date of Patent: Jul. 8, 2008

(54) AUTOMATIC FAULT-TESTING OF LOGIC BLOCKS USING INTERNAL AT-SPEED LOGIC-BIST

(75) Inventors: Venkat Chary Mushirabad, Santa Clara, CA (US); Rajanatha Shettigara, Sunnyvale, CA (US)

(73) Assignee: Genesis Microchip Inc., Santa Clara, CA (US)

( * ) Notice: Subject to any disclaimer, the term of this patent is extended or adjusted under 35 U.S.C. 154(b) by 393 days.

(21) Appl. No.: 11/141,763

(22) Filed: May 31, 2005

(65) Prior Publication Data

US 2006/0107151 A1 May 18, 2006

Related U.S. Application Data

(60) Provisional application No. 60/619,201, filed on Oct. 15, 2004.

(51) Int. Cl.
*G01R 31/28* (2006.01)
(52) U.S. Cl. ...................................... 714/733
(58) Field of Classification Search ................ 714/733
See application file for complete search history.

(56) References Cited

U.S. PATENT DOCUMENTS

| | | | |
|---|---|---|---|
| 4,513,318 A * | 4/1985 | Wilensky et al. ............ 348/181 |
| 5,416,784 A | 5/1995 | Johnson |
| 6,108,252 A * | 8/2000 | Park ........................... 365/201 |
| 6,684,358 B1 * | 1/2004 | Rajski et al. ................ 714/739 |
| 2003/0074619 A1 | 4/2003 | Dorsey |
| 2006/0080584 A1 * | 4/2006 | Hartnett et al. ............. 714/733 |

OTHER PUBLICATIONS

Danish Examination Report dated Feb. 28, 2007 in corresponding Singapore Application No. 200506109-8.
European Office Action dated Oct. 30, 2006 in corresponding EP Appl. No. 05255823.6.

* cited by examiner

*Primary Examiner*—James C Kerveros
(74) *Attorney, Agent, or Firm*—Beyer Law Group LLP

(57) ABSTRACT

System and method for automatic fault-testing of a logic block and the interfaces of macros with logic gates inside a chip, using an at-speed logic-BIST internal to the chip. Following an initialization of internal storage elements, a set of test signals are generated and processed by the logic block. The output of the logic block is accumulated into a signature and compared to a reference signature to detect faults. Testing can be performed on an ATE (Automatic Test Equipment) using a simple test vector, or can be performed by a field engineer on the actual board comprising the chip.

32 Claims, 5 Drawing Sheets

US 7,398,443 B2

AUTOMATIC FAULT-TESTING OF LOGIC BLOCKS USING INTERNAL AT-SPEED LOGIC-BIST

RELATED APPLICATIONS

This patent application takes priority under 35 U.S.C. 119 (e) to U.S. Provisional Patent Application No. 60/619,201 filed on Oct. 15, 2004 entitled "AUTOMATIC FAULT TESTING OF A VIDEO DECODER PORTION OF AN ASIC BY INTERNAL AT-SPEED LOGIC-BIST" by Mushirabad et al, which is incorporated by reference in its entirety.

BACKGROUND OF THE INVENTION

The present invention relates generally to hardware testing and, more particularly, to automatic at-speed fault-testing of logic blocks using logic-BIST (Built-In Self Test) circuits.

Testing of digital logic blocks is commonly performed using automatic testing equipment (ATE) and scan-chains in the digital logic block. Although this approach works, the tests are performed at speeds that are slower than the intended operational speed of the digital logic block under test. Thus, logic which fails at-speed or at desired speeds but passes at low speeds is not detected. In addition, such tests generally do not test the macros interface to the digital logic. Hence, since the interfaces between macros and logic are generally tested individually, failures of the connectivity may not be detected. Furthermore, a complex ATE interface does not allow for convenient testing of a chip in the field by a field engineer.

Accordingly, a system and method is needed for at-speed testing of an entire logic block using a simple ATE interface.

SUMMARY OF THE INVENTION

To achieve the foregoing and other objects and according to the purpose of the present invention, what is provided is a system and method for automatic fault-testing of a logic block and the interfaces of a semiconductor device (chip), using an at-speed logic-BIST circuit internal to the chip. Following an initialization of internal storage elements such as flip-flops or static random-access memories (SRAMs), a set of test signals are generated for processing by the logic block. The output of the logic block is accumulated into a test signature and compared to a reference signature to detect faults. Testing can be performed on an ATE using a simple test vector, and can be performed by a field engineer on the actual board comprising the chip. The ATE vector is simple, since it only needs to trigger the logic-BIST circuit without bothering about external timing constraints.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE INVENTION

In the following description, numerous specific details are set forth in order to provide a thorough understanding of the present invention. It will be understood, however, to one skilled in the art, that the present invention may be practiced without some or all of these specific details. In other instances, well known hardware design, operation and testing processes have not been described in detail in order not to unnecessarily obscure the present invention.

Accordingly, what is provided is a system and method for automatic fault-testing of the logic and the interfaces of a semiconductor device (chip), using an at-speed logic-BIST (Built-In Self Test) circuit internal to the chip. The invention allows testing to be performed on an ATE using a simple test vector. It also allows a field engineer to perform system-level tests on the actual board comprising the chip whenever a doubt as to the functionality of the chip arises. The ATE vector is simple, since it only needs to trigger the logic-BIST circuit without bothering about external timing constraints, since the logic-BIST circuit is internal to the chip.

The following describes the invention in the context of testing a video decoder logic block. However, this embodiment is exemplary and it should be appreciated that the technique can be applied to test any type of digital logic blocks, such as audio decoders, digital signal processors (DSPs) and other data pipes.

Figure 1:
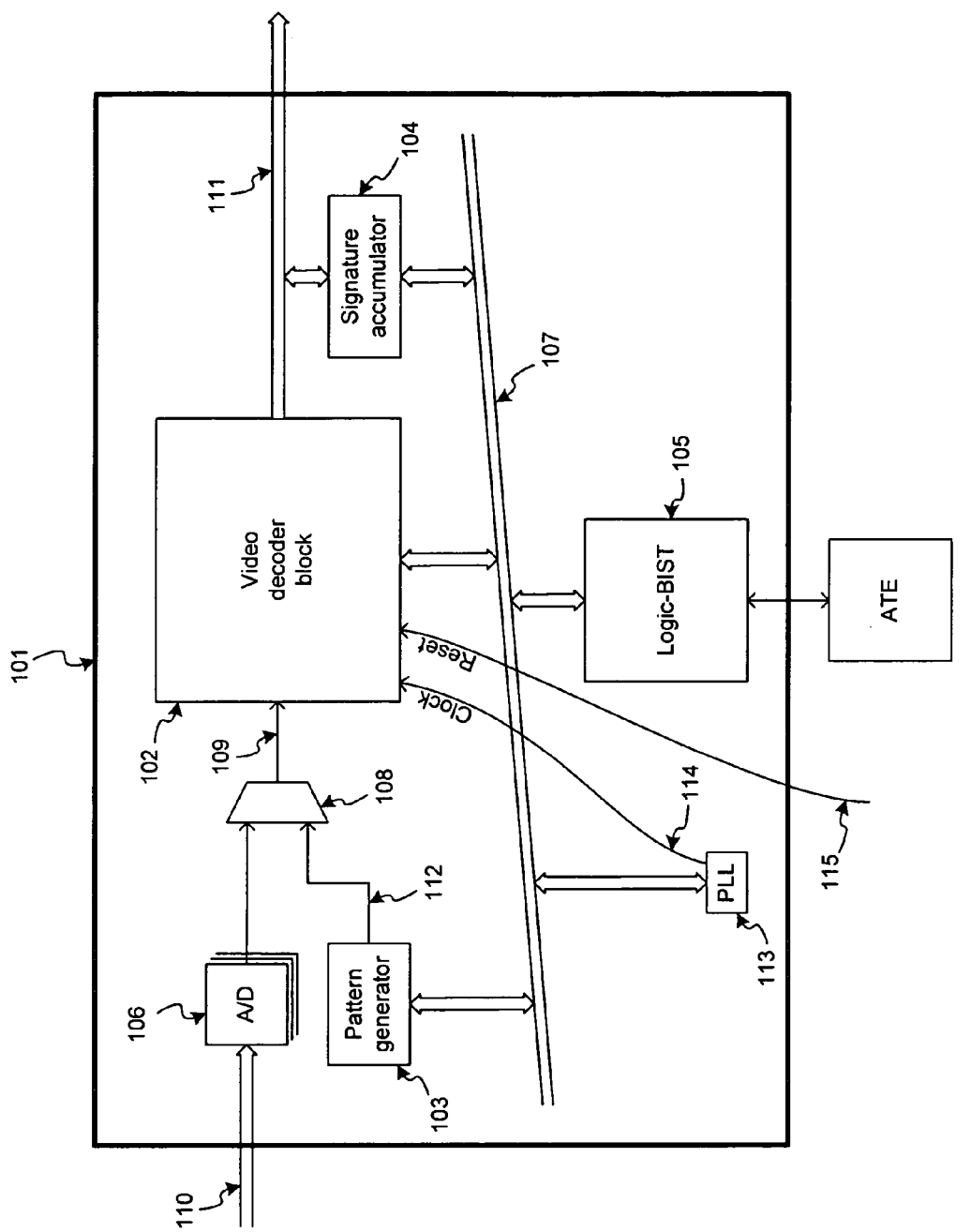
FIG. 1 is a block diagram showing a video decoder integrated circuit, in accordance with an embodiment of the present invention.

FIG. 1 is a block diagram showing a video decoder integrated circuit, in accordance with an embodiment of the present invention. Integrated circuit package 101 (hereinafter also referred to as a "chip") comprises a video decoder logic block 102 providing functional logic for performing video decoding operations on digital input signals 109. The digital input signals 109 are converted from corresponding analog input signals 110 of the chip 101 by one or more analog-to-digital converters 106.

A pattern generator 103 is provided for generating test signals 112 for the video decoder 102. A multiplexer 108 preferably multiplexes converted input signals 110 and test signals 112 generated by the internal pattern generator 103. A signature accumulator 104 is provided for accumulating the output of the video decoder 102 as well as accumulating any desired signals internal to the video decoder 102, at the desired times. A logic-BIST circuit 105 internal to the chip 101 is provided for programming the pattern generator 103, the video decoder 102 and the signature accumulator 104, and/or other parts of the chip (such as the PLL 113) for coordinating tests. The logic-BIST circuit 105 programs the pattern generator 103 to generate test signals comprising boundary conditions and corner cases in order to exercise and test as much of the video decoder 102 functionality as desired, thereby increasing the likelihood of detecting logic faults such as stuck-at faults in the gates and at-speed defects.

In order to generate a deterministic set of video decoder output 111 values in response to a given set of input 112 values generated by the pattern generator 103, feedback logic elements such as flip-flops and memories internal to the video decoder 102 are first initialized. The video decoder 102 can be viewed as a data pipe. Initialization is achieved by driving the video decoder 102 to a condition where such flip-flops and memories at the beginning of the pipe are written to, and by repeatedly generating reset signals for those elements, thereby causing them to assume known values. Repeated application of this technique causes logic further down the pipe to also assume deterministic values. This is continued until all desired flip-flops and memories are initialized. Note that resettable flip-flops may be substituted for some of the non-resettable flip-flops in the video decoder 102 in order to apply this technique.

Figure 2:
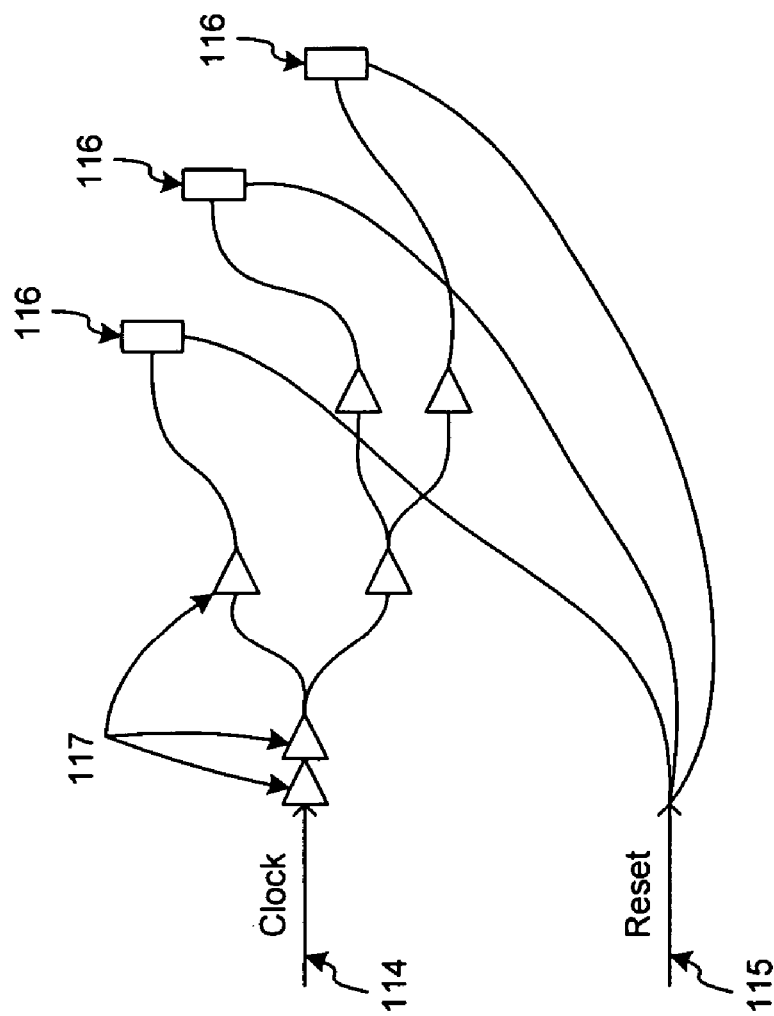
FIG. 2 is a diagrammatic view of a set of flip-flops with an incoming clock tree and reset lines, in accordance with an embodiment of the present invention.

To manage skew of the incoming clock signal 114 (e.g. generated by a Phase Lock Loop 113) and as shown diagrammatically in FIG. 2, some of the flip-flops 116 may receive their clock signals 114 through a set of buffers 117 which form a buffer tree, with the branches of the buffer tree leading into the corresponding flip-flops 116. For the flip-flops 116 reached by the buffer tree, the buffer tree provides a known window of time during which all of the flip-flops 116 see a clock edge. However, if the clocks are connected to the flip-flops 116 via a buffer tree, but the reset lines 115 are not carried to the flip-flops 116 via a buffer tree and are instead applied directly (as is often the case in a logic block), clock edges may reach different flip-flops 116 at different times. Furthermore, a particular flip-flop 116 may receive the reset signal 115 before the clock edge at some times and after the clock edge at other times. Since the reset signal 115 is generally applied during power-on, the result is potentially different flip-flop values across different power-on instances.

Although a scan-chain could be used to flush the flip-flops with known values, robustness of internal scan-chain timing may present difficulties. Therefore, it is desirable to address initialization of flip-flop values in the functional mode of the video decoder 102 without involving scan-chains. Simply applying a reset signal does not accomplish proper flip-flop initialization, because the reset signal does not necessarily reach all flip-flops on the same clock edge. This causes some flip-flops to reset one or more clock cycles before other flip-flops, with the flip-flops reset earlier possibly changing their values by the time other flip-flops are reset, for example due to feedback logic. For example, in some logic sub-blocks comprising feedback, such as ones comprising infinite impulse response (IIR) filters, the output depends not only on current inputs but also on previous values of the outputs.

Figure 3:
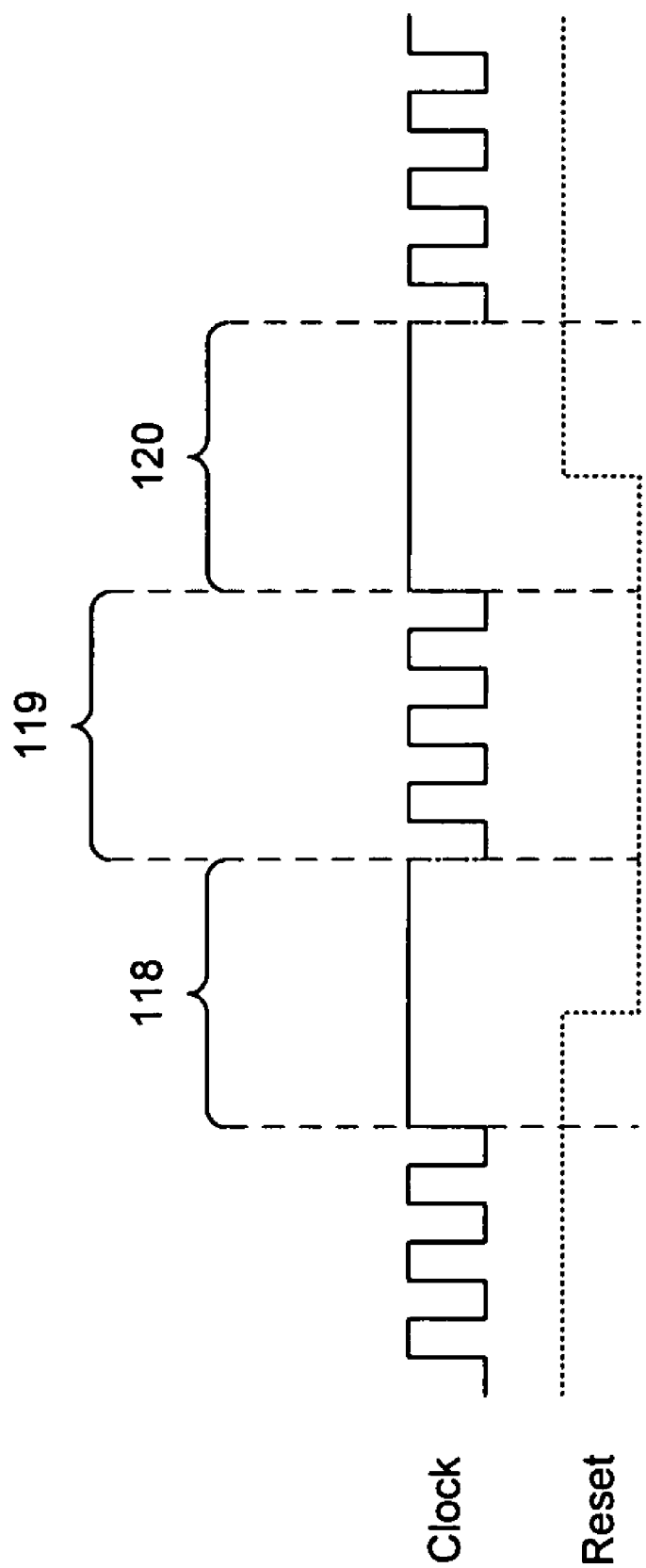
FIG. 3 is a timing diagram showing initialization of flip-flops, in accordance with an embodiment of the present invention.

To address this, the logic-BIST circuit 105 gates the clock signal 114, as shown diagrammatically in FIG. 3 in accordance with an embodiment of the present invention. Gating the clock signal 114 separates it from the reset signal 115 such that inaccuracies in the timing of the reset signal 115 activation or delays in the propagation of the reset signal 115 do not cause the reset signal 115 to reach different elements at different clock cycles. This prevents unknown values from propagating into already-reset memories or flip-flops.

The clock signal 114 is gated for an equivalent of a few clock cycles 118 during which the reset signal 115 is activated (active is low for the example shown in FIG. 3). The clock signal 114 is gated long enough for the reset signal 115 to propagate to all the elements that are to be initialized using the reset signal 115. With the reset signal 115 held active, the clock 114 is resumed for a number of cycles 119, causing those elements that are reached by the reset signal 115 to reset. In our example, 4 to 20 clock cycles have been found to work well, and this can be adjusted for the particular logic block under test. The clock signal 114 is then gated again for an equivalent of a few clock cycles 120 during which the reset signal 115 is deactivated, thereby allowing all the reset elements to see an inactive reset signal 115 at the next clock edge.

A practical upper bound on the number of clock cycles needed to fully initialize the logic blocks can be determined using a software simulator which simulates the operation of the logic block 102. Unknown bit-values of flip-flops or memories in the simulator can be designated as "unknown" or "un-initialized" and propagated through the logic block 102 until they are replaced with known values. The number of clock cycles can be increased until there are no more unknown values, and the resulting number of clock cycles can then be used to test the logic block 102.

In addition to initializing flip-flops, memories are written to so that they assume known values prior to a test. In a video decoder 102, most memories are used not for random-access but instead as delays, with a memory element that comprises n memory locations serving as an n-delay. The inputs to such an n-delay migrate sequentially through the n memory locations, each input ready to be read out after a delay of n shifts. Hence, in order to drive an n-delay into a known state with a known set of values, a total of n known values are fed into the n-delay.

Figure 4:
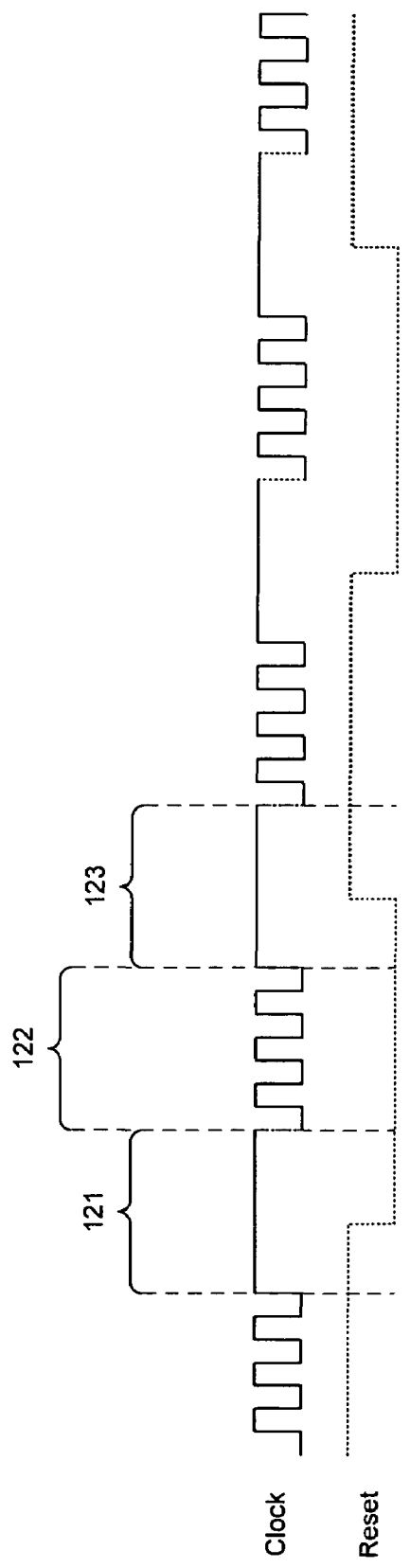
FIG. 4 is a timing diagram showing initialization of memories, in accordance with an embodiment of the present invention.

Since a particular n-delay may receive an input from a flip-flop whose value is updated every m clock cycles, n·m clock cycles are needed to drive such an n-delay to a known state. To achieve this, the logic-BIST circuit 105 gates the incoming clock signal 114 for an equivalent of a few clock cycles 121 during which the reset signal 115 is activated, as shown diagrammatically in FIG. 4 in accordance with an embodiment of the present invention. With the reset signal 115 held active, the clock 114 is resumed for n·m clock cycles 122 in order to reset inputs to the n-delay and thereby flush the n-delay. The clock signal 114 is then gated again for an equivalent of a few clock cycles 123 during which the reset signal 115 is deactivated, thereby allowing all the reset elements to see an inactive reset signal 115 at the next clock edge. This process can be repeated (as shown in FIG. 4) to flush n-delays further down the pipe. As with initializing flip flops, software simulation can be used to determine a proper number for representing the theoretical n·m figure, as well as to determine the values stored in the n-delays at the end of such initialization.

After initializing the flip-flops and memories, the logic-BIST circuit 105 activates the pattern generator 103. The pattern generator 103 preferably comprises one or more registers that can be programmed by the logic-BIST circuit 105 to indicate a mode of operation of the pattern generator 103 and to choose a set of test signals to be generated. The signals 112 generated by the pattern generator may be according to standards such as NTSC (National Television Standards Committee), PAL (Phase Alternation Line), SECAM (Système Électronique Couleur avec Mèmoire), composite video, S-video ("Separate" Video), component video, or other similar standard. The pattern generator may also generate non-standard signals (such as random signals, pseudo-random signals or other unexpected signals) which can increase the test coverage. Note that depending on the particular shape of the incoming signal, some parts of the video decoder 102 may remain untested, since not every part of the video decoder 102 is necessarily engaged in decoding every incoming signal 109. Therefore, in order to fully test the video decoder 102, the pattern generator 103 generates proper signal patterns in order to engage and test as many portions and functionalities of the video decoder as desired. Note that since video decoders generally have some internal logic for providing test signals to be viewed on a display, the pattern generator 103 of the present invention does not represent significant added test-related gate overhead.

An ATE or other external mechanism can be used to trigger the logic-BIST circuit 105 and initiate testing of the video decoder 102, specifying an operational mode chosen from the set of operational modes available to the video decoder 102. Logic-BIST circuit 105 programs the pattern generator 103 to generate a set of test data for the video decoder 102, programs the video decoder 102 to operate in a desired operational mode for processing the generated test data, and programs the signature accumulator 104 to collect the output from the video decoder 102. Logic-BIST circuit 105 programs the pattern generator 103, the video decoder 102, the PLL 113 and the signature accumulator 104 by communicating with them over the bus 107 according to their programming interfaces (such as a set of registers for accepting commands and inputs and optionally for indicating outputs).

Signature accumulator 104 uses a CRC (cyclic redundancy check) mechanism to accumulate the entire decoder output to a signature. In essence, the video decoder 102 output values are compressed into a single value referred to as the "test signature" (or alternatively compressed into a set of values). CRC ensures that the test signature will differ from a correct reference signature even in the presence of a slight change (such as a one-bit change) of the decoder 102 output. The logic-BIST circuit 105 determines the actual times at which the signature accumulator 104 reads the consecutive outputs of the video decoder 102. At the end of a test, the final value (signature) stored in the CRC output register is a function of the sequence of outputs produced by the video decoder 102 during the test.

Given a particular test, a reference signature representing fault-free processing by the video decoder 102 can be computed using software simulation. The logic-BIST circuit 105 can cause the final values to be written to a register which can then be read and compared to the values predicted by the software simulation. A match indicates a good chip (i.e. a correctly functioning logic block), while a mismatch indicates a fault in the video decoder 102 logic block. Note that a signature mismatch indicates a fault in the logic block under test, and not a bug in the underlying algorithm implemented by the logic block, since the reference signature is obtained by simulating the logic block. It should also be appreciated that in addition to the direct output 111 of the video decoder 102, the bits collected by the CRC into a test signature may include any other internal signal lines of the video decoder 102. This enables testing of specific sub-blocks or narrowing down faults to specific areas of the video decoder 102.

Figure 5:
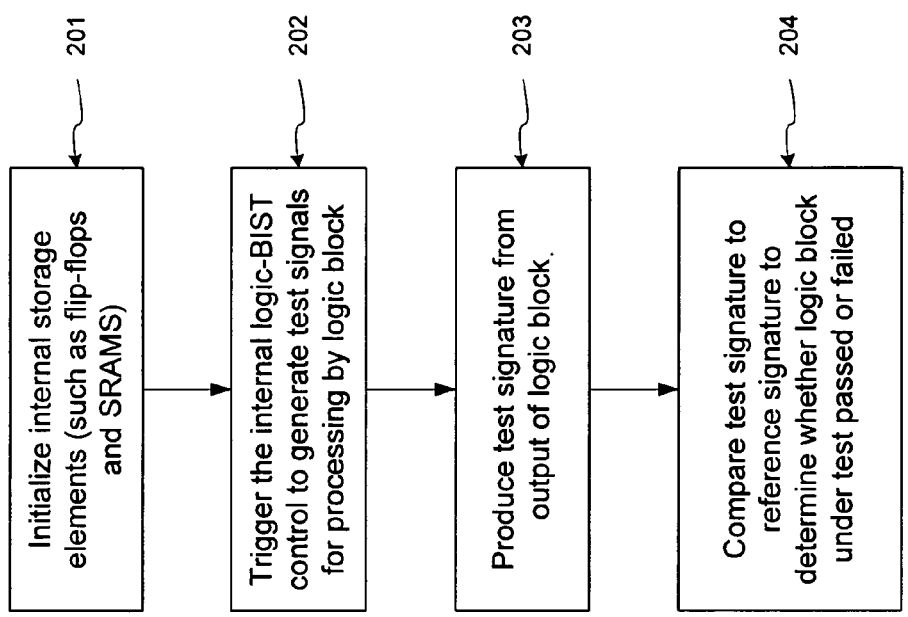
FIG. 5 is a flow diagram illustrating a method for at-speed fault-testing of a logic block, in accordance with an embodiment of the present invention.

FIG. 5 is a flow diagram illustrating a method for at-speed fault-testing of a logic block, in accordance with an embodiment of the present invention. At step 201, initialize flip-flops and memories of the logic block 102. At step 202, trigger the internal logic-BIST control to generate test signals for processing by the logic block 102. At step 203, produce a test signature from the output of the logic block 102. Finally, at step 204, compare the test signature to a reference signature in order to determine whether the logic block 102 passed of failed the test.

Although the invention has been described in the context of a video decoder logic block, it should be appreciated that it can also be used to test other types of logic blocks that accept a set of input signals and deterministically generate a set of output signals. Examples of such logic blocks include audio decoders, DSPs and other data pipes.

One advantage of the present invention is the ability to conduct fault-testing of a logic block at the intended operational speed of the logic block without the use of a complex ATE for feeding clock and test data at correct phase.

Another advantage of the present invention is the ability to test a given logic block in the field. A logic block that is packaged into a chip and made part of an integrated circuit board can be tested by a field engineer simply by re-programming the chip to enter a test-mode, eliminating costs which are otherwise involved in taking the board or the chip to a tester with complex or specialized test equipment.

Another advantage of the present invention is the ability to test more gates and macros (such as memories and PLLs) than when using a scan-chain test method. Some logic blocks, in anticipation of a scan-chain based testing approach, comprise multiplexers which feed two kinds of input into a memory: one input comprises a set of gates for providing a portion of the logic block functionality, while another input comprises a set of gates for generating test input for the memory. Since a typical scan-chain based approach tests the gates and the memories separately, the multiplexers are not tested and may harbor stuck-at faults or other faults compromising logic block functionality. In contrast, the present invention tests the logic block in a fully functional mode and as a whole, exposing faults that would remain undetected when testing portions of the logic block separately.

Another advantage of the present invention is the provision of a simple ATE interface. Since almost everything is done internally within the chip and the logic-BIST circuit controls the chip by gating the clock and reset lines, the ATE interface is kept simple and provides a way to simply program the logic-BIST circuit to choose the test-modes, perform the tests and collect test results.

Another advantage of the present invention is that unlike other logic-BIST circuit approaches, the provided test cases are not random but are designed to test as many features of the logic block as desired. This capability increases the likelihood of detecting stuck-at faults in most gates.

Foregoing described embodiments of the invention are provided as illustrations and descriptions. They are not intended to limit the invention to precise form described. Other variations and embodiments are possible in light of above teachings, and it is thus intended that the scope of invention not be limited by this Detailed Description, but rather by claims following.

We claim:

1. A semiconductor device, comprising:
   a logic block having a set of flip-flops and memories connected to a clock signal and a reset signal;
   a pattern generator for generating a set of test signals for processing by the logic block;
   a signature accumulator for producing a test signature based on a set of outputs produced by the logic block upon processing the test signals; and
   a built-in self-test (logic-BIST) circuit for initializing the flip-flops and memories by writing to the flip-flops and memories known values of the reset signal during a same number of clock cycles and initiating testing of the logic block;
   wherein initializing the flip-flops and memories causes them to simultaneously store the known values despite timing variations or propagation delays of the reset signal across the flip-flops and memories.

2. A semiconductor device as recited in claim 1, the logic-BIST circuit for initializing the flip-flops and memories by performing the following sequence:
   (a) gating the clock signal;
   (b) activating the reset signal;
   (c) resuming the clock signal while holding the reset signal active;
   (d) gating the clock signal again; and (e) deactivating the reset signal.

3. A semiconductor device as recited in claim 2, the logic-BIST circuit further for comparing the test signature to a reference signature, the reference signature representing the result of fault-free processing of the set of test signals by the logic block.

4. A semiconductor device as recited in claim 3, wherein the reference signature is computed by simulating fault-free operation of the logic block on the set of test signals.

5. A semiconductor device as recited in claim 2, wherein the logic block comprises a video decoder logic block for decoding video signals, and the pattern generator generates the set of test signals according to a standard selected from the group consisting of NTSC, PAL, SECAM, composite video, S-video, and component video or according to non-standard inputs in order to increase fault coverage.

6. A semiconductor device as recited in claim 2, wherein the signature accumulator comprises a cyclic redundancy check (CRC) for producing the test signature by incrementally compressing the set of outputs produced by the logic block.

7. A semiconductor device as recited in claim 2, wherein the logic-BIST circuit determines the times at which the signature accumulator reads the set of outputs produced by the logic block.

8. A semiconductor device as recited in claim 1, the logic block having a memory element, the logic-BIST further for initializing the memory element by flushing it with known values.

9. A method for testing a logic block having a set of flip-flops connected to a clock signal and a reset signal, the method comprising:
  initializing the set of flip-flops by writing to the flip-flops known values of the reset signal during a same number of clock cycles;
  generating a set of test signals for processing by the logic block; and
  producing a test signature based on a set of outputs produced by the logic block upon processing the test signals;
  wherein initializing the set of flip-flops causes them to simultaneously store the known values despite timing variations or propagation delays of the reset signal across the set of flip-flops.

10. A method as recited in claim 9, wherein initializing the set of flip-flops comprises the following sequence:
  (a) gating the clock signal;
  (b) activating the reset signal;
  (c) resuming the clock signal while holding the reset signal active;
  (d) gating the clock signal again; and
  (e) deactivating the reset signal.

11. A method as recited in claim 10, further comprising:
  comparing the test signature to a reference signature, the reference signature representing the result of fault-free processing of the set of test signals by the logic block.

12. A method as recited in claim 11, wherein the reference signature is computed by simulating fault-free operation of the logic block on the set of test signals.

13. A method as recited in claim 10, wherein the logic block comprises a video decoder logic block for decoding video signals, and the set of test signals are generated according to a standard selected from the group consisting of NTSC, PAL, SECAM, composite video, S-video, and component video.

14. A method as recited in claim 10, wherein producing the test signature comprises incremental compression of the set of outputs produced by the logic block.

15. A method as recited in claim 14, wherein incremental compression of the set of outputs comprises using a linear feedback shift register (LFSR).

16. A method as recited in claim 10, wherein generating a set of test signals is performed by a pattern generator residing in the same semiconductor device as the logic block.

17. A method as recited in claim 10, wherein producing a test signature is performed by a signature accumulator residing in the same semiconductor device as the logic block.

18. A method as recited in claim 10, wherein initializing the set of flip-flops is performed by a built-in self test circuit (logic-BIST) residing in the same semiconductor device as the logic block.

19. A method as recited in claim 9, the logic block having a memory element, further comprising:
  initializing the memory element by flushing it with known values.

20. A method as recited in claim 19, wherein flushing the memory element comprises the following sequence:
  (a) gating the clock signal;
  (b) activating the reset signal;
  (c) resuming the clock signal while holding the reset signal active;
  (d) gating the clock signal again; and
  (e) deactivating the reset signal.

21. A method for testing a semiconductor device having a logic block, a pattern generator, a signature accumulator and a built-in self test (logic-BIST) circuit, comprising:
  causing the logic-BIST circuit to perform the following:
    (a) initializing a set of flip-flops and memories of the logic block, the set of flip-flops connected to a clock signal and a reset signal, by writing to the flip-flops and memories known values of the reset signal during a same number of clock cycles;
    (b) triggering the pattern generator to generate a set of test signals for processing by the logic block; and
    (c) causing the signature accumulator to produce a test signature based on a set of outputs produced by the logic block upon processing the test signals; and
  comparing the test signature to a reference signature, the reference signature representing the result of fault-free processing of the set of test signals by the logic block;
  wherein initializing the set of flip-flops and memories causes them to simultaneously store the known values despite timing variations or propagation delays of the reset signal across the set of flip-flops.

22. A method as recited in claim 21, the logic-BIST circuit for initializing the set of flip-flops and memories by performing the following sequence:
  (f) gating the clock signal;
  (g) activating the reset signal;
  (h) resuming the clock signal while holding the reset signal active;
  (i) gating the clock signal again; and
  (j) deactivating the reset signal.

23. A method as recited in claim 22, wherein the reference signature is computed by simulating fault-free operation of the logic block on the set of test signals.

24. A method as recited in claim 22, wherein the logic block comprises a video decoder logic block for decoding video signals, and the pattern generator generates the set of test signals according to a standard selected from the group consisting of NTSC, PAL, SECAM, composite video, S-video, and component video.

25. A method as recited in claim 22, wherein the signature accumulator comprises a linear feedback shift register (LFSR) for producing the test signature by incrementally compressing the set of outputs produced by the logic block.

26. A method as recited in claim 22, wherein the logic-BIST circuit determines the times at which the signature accumulator reads the set of outputs produced by the logic block.

27. Computer program product for testing a logic block having a set of flip-flops connected to a clock signal and a reset signal, comprising:

computer code for initializing the set of flip-flops by writing to the flip-flops known values of the reset signal during a same number of clock cycles;

computer code for generating a set of test signals for processing by the logic block; and computer code for producing a test signature based on a set of outputs produced by the logic block upon processing the test signals; and computer readable medium for storing the computer code;

wherein initializing the set of flip-flops causes them to simultaneously store the known values despite timing variations or propagation delays of the reset signal across the set of flip-flops.

28. Computer program product as recited in claim 27, wherein the computer code for initializing the set of flip flops comprises:

computer code for simultaneously storing known values despite timing variations or propagation delays of the reset signal across the set of flip-flops.

29. Computer program product as recited in claim 28, wherein computer code for initializing the set of flip-flops comprises:

computer code for gating the clock signal;

computer code for activating the reset signal;

computer code for resuming the clock signal while holding the reset signal active;

computer code for gating the clock signal again; and computer code for deactivating the reset signal.

30. Computer program product as recited in claim 29, further comprising:

computer code for comparing the test signature to a reference signature, the reference signature representing the result of fault-free processing of the set of test signals by the logic block.

31. Computer program product as recited in claim 30, wherein the reference signature is computed by simulating fault-free operation of the logic block on the set of test signals.

32. Computer program product as recited in claim 31, wherein the logic block comprises a video decoder logic block for decoding video signals, and the set of test signals are generated according to a standard selected from the group consisting of NTSC, PAL, SECAM, composite video, S-video, and component video.

* * * * *